(12) United States Patent
Su et al.

(10) Patent No.: US 12,183,723 B2
(45) Date of Patent: *Dec. 31, 2024

(54) SEMICONDUCTOR PACKAGE WITH DUMMY MIM CAPACITOR DIE

(71) Applicant: MediaTek Inc., Hsin-Chu (TW)

(72) Inventors: Yao-Chun Su, Hsinchu (TW); Chih-Ching Chen, Hsinchu (TW); I-Hsuan Peng, Hsinchu (TW); Yi-Jou Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,318

(22) Filed: Oct. 25, 2022

(65) Prior Publication Data

US 2023/0044797 A1 Feb. 9, 2023

Related U.S. Application Data

(63) Continuation of application No. 16/869,574, filed on May 7, 2020, now Pat. No. 11,508,707.
(Continued)

(51) Int. Cl.
| | |
|---|---|
| *H01L 25/16* | (2023.01) |
| *H01L 23/00* | (2006.01) |
| *H01L 23/16* | (2006.01) |
| *H01L 23/31* | (2006.01) |
| *H01L 23/367* | (2006.01) |

(Continued)

(52) U.S. Cl.
CPC ............. *H01L 25/16* (2013.01); *H01L 23/16* (2013.01); *H01L 23/3128* (2013.01); *H01L 23/3675* (2013.01); *H01L 23/5383* (2013.01); *H01L 23/5386* (2013.01); *H01L 23/562* (2013.01); *H01L 24/16* (2013.01); *H01L 28/60* (2013.01); *H01L 2224/16227* (2013.01); *H01L 2924/19041* (2013.01); *H01L 2924/19105* (2013.01)

(58) Field of Classification Search
CPC ....... H01L 27/0248–0296; H01L 23/552–556; H01L 23/36–3738; H01L 2924/3511; H01L 2924/19041; H01L 2924/19105; H01L 25/16
See application file for complete search history.

(56) References Cited

U.S. PATENT DOCUMENTS 9,330,997 B1 * 5/2016 Lim ................... H01L 23/367
9,349,681 B1   5/2016 Kelly
(Continued)

FOREIGN PATENT DOCUMENTS

CN      107799499 A    3/2018
CN      108573936 A    9/2018
(Continued)

OTHER PUBLICATIONS

Extended European Search Report issued Jul. 13, 2020 in connection with European Application No. 20174671.6.

*Primary Examiner* — Victor A Mandala
*Assistant Examiner* — Lawrence C Tynes, Jr.
(74) *Attorney, Agent, or Firm* — Winston Hsu

(57) ABSTRACT

A semiconductor package including at least one functional die; at least one dummy die free of active circuit, wherein the dummy die comprises at least one metal-insulator-metal (MIM) capacitor; and a redistribution layer (RDL) structure interconnecting the MIM capacitor to the at least one functional die.

12 Claims, 6 Drawing Sheets

Related U.S. Application Data

(60) Provisional application No. 62/848,066, filed on May 15, 2019.

(51) Int. Cl.
  *H01L 23/538* (2006.01)
  *H01L 49/02* (2006.01)

(56) References Cited

U.S. PATENT DOCUMENTS

| | | | |
|---|---|---|---|
| 9,824,988 B1 | 11/2017 | Lee | |
| 11,508,707 B2 * | 11/2022 | Su | H01L 23/3128 |
| 2008/0316714 A1 | 12/2008 | Eichelberger | |
| 2009/0224400 A1 | 9/2009 | Rahman | |
| 2010/0025841 A1 * | 2/2010 | Kakegawa | H01L 25/0655 |
| | | | 257/692 |
| 2013/0119552 A1 | 5/2013 | Lin | |
| 2014/0264816 A1 | 9/2014 | Kalchuri | |
| 2015/0364538 A1 | 12/2015 | Wang | |
| 2016/0300797 A1 * | 10/2016 | Shim | H01L 21/561 |
| 2017/0243826 A1 * | 8/2017 | Lin | H01L 21/4853 |
| 2017/0263470 A1 * | 9/2017 | Lin | H01L 23/49827 |
| 2018/0047683 A1 | 2/2018 | Lee | |
| 2018/0068978 A1 * | 3/2018 | Jeng | H01L 25/50 |
| 2019/0013301 A1 * | 1/2019 | Cheah | H01L 21/6836 |
| 2019/0103359 A1 * | 4/2019 | Kong | H01L 25/16 |
| 2019/0304935 A1 * | 10/2019 | Collins | H01L 21/4857 |
| 2020/0091112 A1 * | 3/2020 | Do | H01L 23/3128 |
| 2020/0176417 A1 | 6/2020 | Navaja | |
| 2020/0185367 A1 * | 6/2020 | Bhagavat | H01L 25/16 |
| 2020/0328195 A1 * | 10/2020 | Fallin | H01L 28/40 |
| 2020/0365572 A1 | 11/2020 | Su et al. | |

FOREIGN PATENT DOCUMENTS

| | | |
|---|---|---|
| TW | 201843806 A | 12/2018 |
| WO | 2009/022252 A2 | 2/2009 |

* cited by examiner

SEMICONDUCTOR PACKAGE WITH DUMMY MIM CAPACITOR DIE

CROSS REFERENCE TO RELATED APPLICATIONS

This Application is a Continuation of U.S. application Ser. No. 16/869,574, filed May 7, 2020, entitled "SEMICONDUCTOR PACKAGE WITH DUMMY MIM CAPACITOR DIE", which claims priority from U.S. Application Ser. No. 62/848,066, filed May 15, 2019. The entire contents of these applications are incorporated herein by reference in their entireties.

BACKGROUND

The present disclosure relates generally to the field of semiconductor packaging. More particularly, the present disclosure relates to a semiconductor package with at least one dummy metal-insulator-metal (MIM) capacitor die.

Typically, integrated circuits (ICs) are assembled into packages by physically and electrically coupling them to a package substrate. One or more ICs or IC packages can be physically and electrically coupled to a printed circuit board (PCB) to form an electronic assembly.

In the formation of conventional IC packages, dummy dies are typically incorporated to reduce the warpage and alleviate the loading effects. The dummy dies and the functional dies are molded together so as to form a reconstructed wafer. After the formation of redistribution layer (RDL) connecting to the functional dies, the reconstructed wafer is sawed into a plurality of IC packages. The dummy dies in each IC package are placed side-by-side with the functional dies.

As the internal circuitry of high-performance ICs, such as processors, operates at higher and higher clock frequencies, noise in the power and ground lines increasingly reaches an unacceptable level. This noise can arise due to inductive and capacitive parasitics, for example. To reduce such noise, capacitors known as decoupling or by-pass capacitors are often used to provide a stable signal or stable supply of power to the circuitry.

In addition, as electronic devices continue to advance, there is an increasing need for higher levels of capacitance at reduced inductance levels for decoupling, power dampening, and supplying charge. In addition, there is a need for capacitance solutions that do not interfere with package connectors of various types, and which do not limit the industry to certain device sizes and packing densities.

Accordingly, there is a need in the art for alternative capacitance solutions in the fabrication and operation of electronic devices and their packages.

SUMMARY

It is an object of the invention to provide an improved semiconductor package with at least one dummy MIM capacitor die in order to solve the above-mentioned prior art problems or shortcomings.

One aspect of the invention provides a semiconductor package including at least one functional die; at least one dummy die free of active circuit, wherein the dummy die comprises at least one metal-insulator-metal (MIM) capacitor; and a redistribution layer (RDL) structure interconnecting the MIM capacitor to the at least one functional die.

According to some embodiments, the at least one functional die and the at least one dummy die are arranged in a side-by-side manner on the RDL structure.

According to some embodiments, the at least one functional die and the at least one dummy die are encapsulated and surrounded by a molding compound.

According to some embodiments, the RDL structure is electrically connected to a package substrate through a plurality of first connecting elements.

According to some embodiments, a plurality of second connecting elements is disposed on a lower surface of the package substrate.

According to some embodiments, the RDL structure comprises a dielectric layer and a fan-out wiring layer that interconnects the at least one dummy die to the at least one functional die According to some embodiments, the MIM capacitor comprises a capacitor bottom metal, a capacitor top metal, and an insulator layer between the capacitor bottom metal and the capacitor top metal.

Another aspect of the invention provides a semiconductor package including at least one functional die; at least one dummy die free of active circuit, wherein the dummy die comprises at least one passive circuit element; and a redistribution layer (RDL) structure interconnecting the at least one passive circuit element to the at least one functional die.

According to some embodiments, the at least one passive circuit element comprises a metal-insulator-metal (MIM) capacitor.

According to some embodiments, the at least one functional die and the at least one dummy die are arranged in a side-by-side manner on the RDL structure.

According to some embodiments, the at least one functional die and the at least one dummy die are encapsulated and surrounded by a molding compound.

According to some embodiments, the RDL structure is electrically connected to a package substrate.

Still another aspect of the invention provides a semiconductor package including multiple functional dies; at least one dummy die free of active circuit, wherein the dummy die comprises at least one passive circuit element; a redistribution layer (RDL) structure interconnecting the at least one passive circuit element to at least one of the multiple functional dies; a molding compound encapsulating and surrounding the at least one functional die and the multiple functional dies; a package substrate interconnecting to the RDL structure through a plurality of first connecting elements; and a stiffener ring mounted on a top surface of the package substrate.

According to some embodiments, the at least one passive circuit element comprises a metal-insulator-metal (MIM) capacitor.

According to some embodiments, the MIM capacitor comprises a capacitor bottom metal, a capacitor top metal, and an insulator layer between the capacitor bottom metal and the capacitor top metal.

According to some embodiments, the at least one functional die and the multiple functional dies are arranged in a side-by-side manner on the RDL structure.

According to some embodiments, the semiconductor package further comprises at least one die-side capacitor mounted on the top surface of the package substrate.

According to some embodiments, the semiconductor package further comprises at least one land-side capacitor mounted on a lower surface of the package substrate.

According to some embodiments, a plurality of second connecting elements is disposed on the lower surface of the package substrate.

According to some embodiments, the RDL structure comprises a dielectric layer and a fan-out wiring layer that interconnects the at least one dummy die to the at least one functional die.

The dummy die (or dummy MIM capacitor die) is used to improve the power integrity (PI) of the semiconductor package, reduce the warpage and alleviate the loading effects during semiconductor processes such as chemical mechanical polishing (CMP) or plating processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The present disclosure pertains to a semiconductor package with at least one functional die and at least one dummy die. For example, in accordance with one embodiment, a fan-out system-in-package (SiP) comprising multiple functional dies and at least one dummy die packaged together within one enclosure is disclosed. According to embodiments of the disclosure, the dummy die in the fan-out SiP is free of active circuit and comprises a passive circuit element such as capacitors, inductors, or resistors. For example, the capacitors are metal-insulator-metal (MIM) capacitors. The dummy die (or dummy MIM capacitor die) is used to improve the power integrity (PI) of the semiconductor package, reduce the warpage and alleviate the loading effects during semiconductor processes such as chemical mechanical polishing (CMP) or plating processes.

Figure 1:
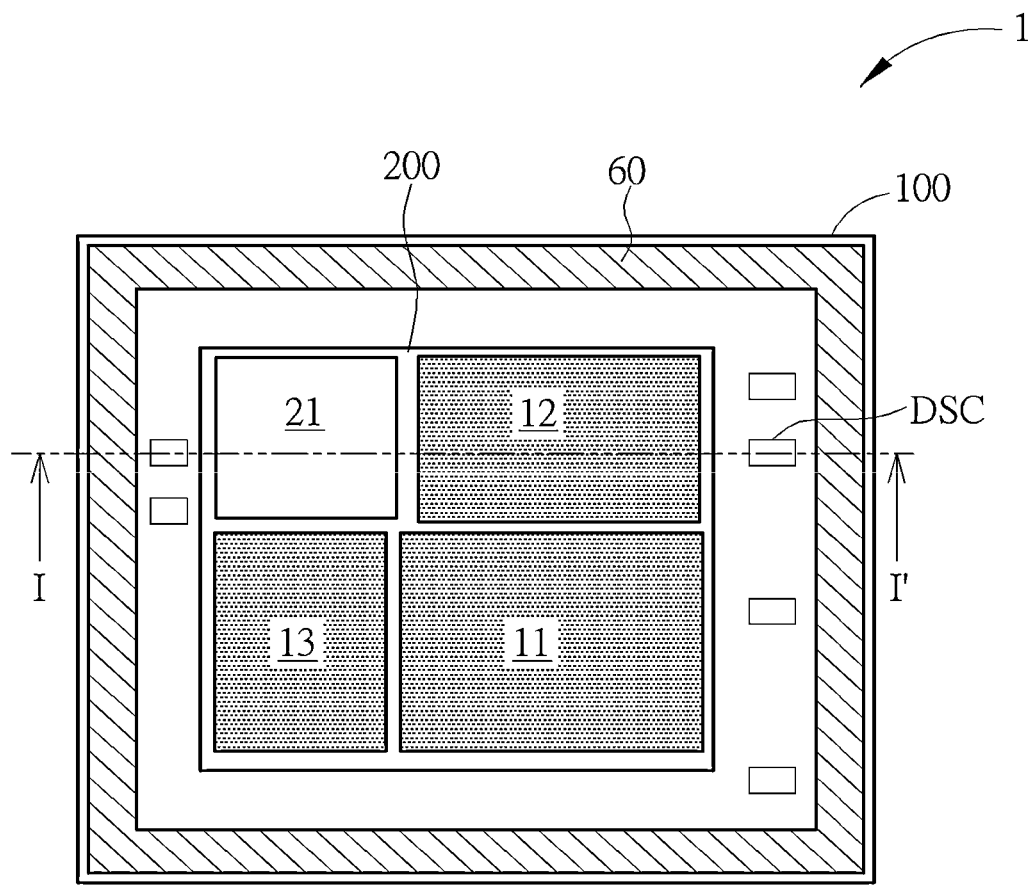
FIG. 1 is a schematic, perspective top view showing an exemplary layout of a fan-out SiP with multiple functional dies and a dummy die in accordance with one embodiment of the invention.
Figure 2:
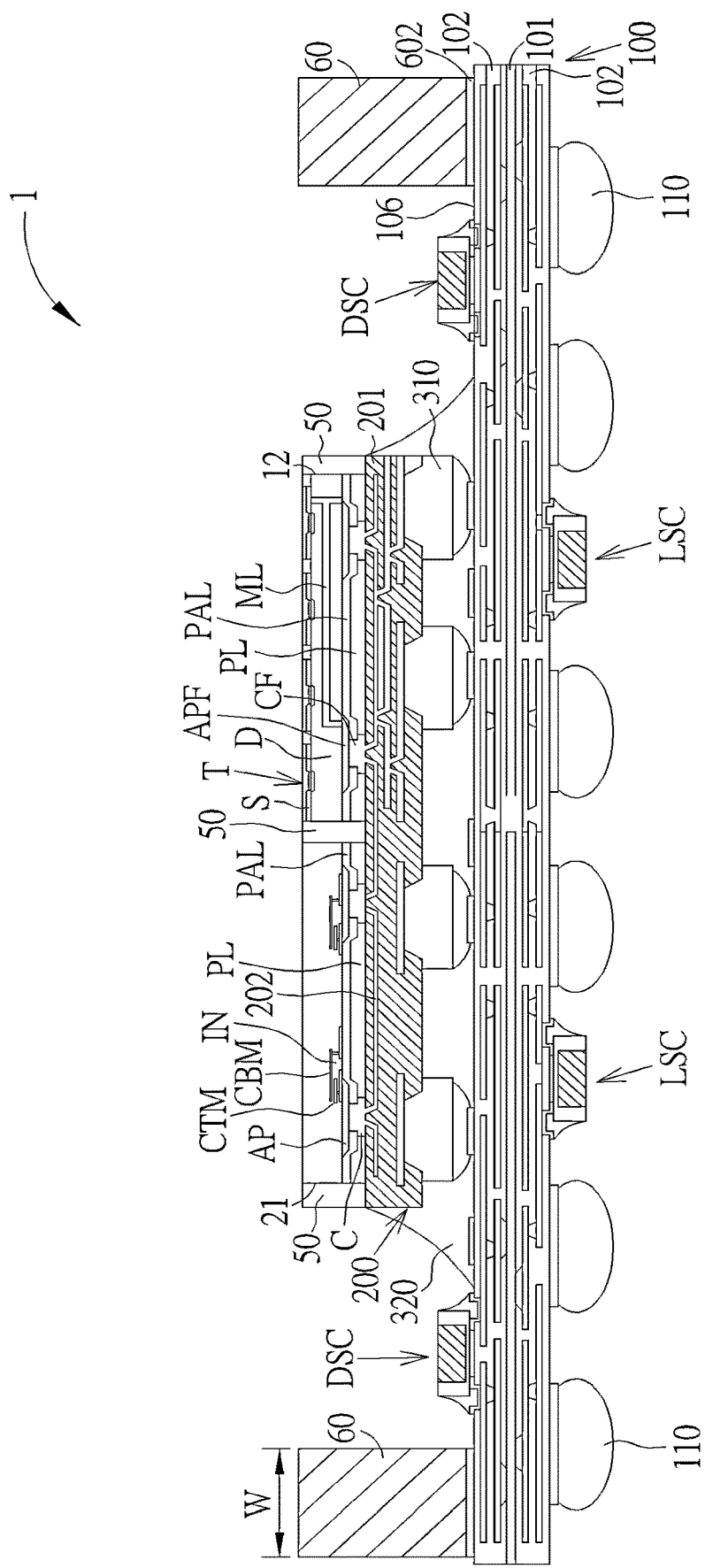
FIG. 2 is a schematic, cross-sectional view taken along line I-I' in FIG. 1.

Please refer to FIG. 1 and FIG. 2. FIG. 1 is a schematic, perspective top view showing an exemplary layout of a fan-out SiP 1 with multiple functional dies and a dummy die in accordance with one embodiment of the invention. FIG. 2 is a schematic, cross-sectional view taken along line I-I' in FIG. 1. As shown in FIG. 1 and FIG. 2, the fan-out SiP 1 comprises multiple functional dies 11, 12, and 13 arranged in a side-by-side manner on a package substrate 100. The multiple functional dies 11, 12, and 13 may have various sizes. A dummy die 21, which is free of any active circuit elements such as MOS transistors, is disposed between the functional die 12 and the functional die 13 so as to provide an approximately rectangular outline of the die arrangement, which is basically coextensive with the shape or outline of the package substrate 100. For example, the functional dies 11, 12, and 13 and the dummy die 21 are silicon dies. For example, the functional die 11 may be a digital die such as a SoC die, and the functional dies 12, 13 may be a DRAM memory die, a flash memory die, a networking die, an Accelerated Processing Unit (APU) die, a RF die, or the like.

According to one embodiment, the dummy die 21 helps provide a more symmetric geometry, which is beneficial to balance process loading effect. For example, the dummy die 21 could balance molding and top die distribution which could balance the stress during the grinding process. Further, the warpage control can be improved due to the incorporation of the dummy die 21. The dummy die 21 and the functional dies 11, 12, and 13 are encapsulated and surrounded by a molding compound 50. The dummy die 21 and the functional dies 11, 12, and 13 are interconnected to one another through a redistribution layer (RDL) structure 200.

According to one embodiment, the RDL structure 200 comprises dielectric layers 201 and fan-out wiring layers 202 that interconnect the dummy die 21 to the functional dies 11, 12, and 13. For example, the dielectric layer 201 may be made of any suitable material including, but not limited to, polyimide (PI), polybenzoxazole (PBO), BCB, epoxy, silicone, acrylates, pheno resin, siloxane, fluorinated polymer, polynorbornene, oxide, nitride, or the like. Formation of RDL structure 200 may include patterning the dielectric material (e.g., using photolithography and/or etching processes) and forming conductive features in and/or on the patterned dielectric layers.

Figure 3:
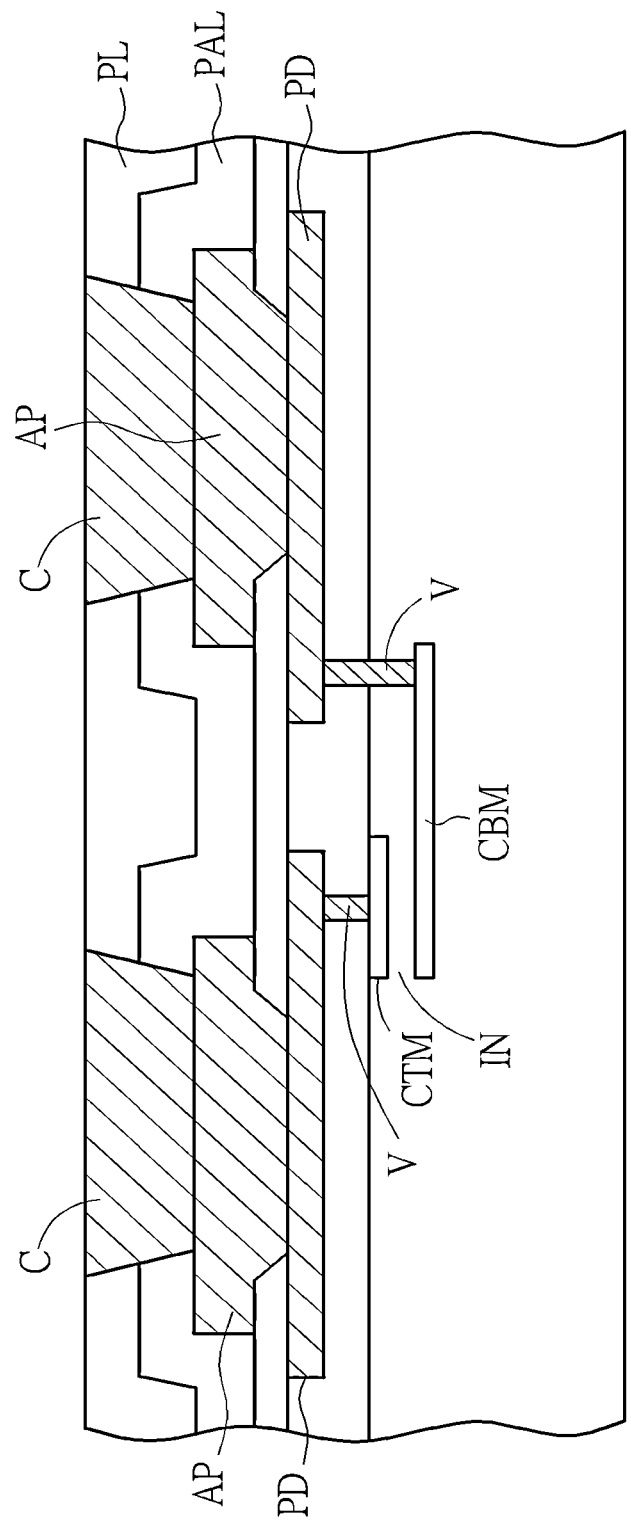
FIG. 3 is an enlarged view of an exemplary dummy MIM capacitor die as set forth in FIG. 2 according to one embodiment.

In FIG. 2, two exemplary MIM capacitors C1 and C2 are shown in the dummy die 21 for illustration purposes. Please refer to FIG. 3, each of the MIM capacitors C1 and C2 may comprise a capacitor bottom metal CBM, a capacitor top metal CTM, and an insulator layer IN between the capacitor bottom metal CBM and the capacitor top metal CTM. For example, the capacitor top metal CTM and the capacitor bottom metal CBM may comprise copper, but is not limited thereto. For example, the insulator layer IN may comprise silicon oxide or silicon nitride, but is not limited thereto. For example, each of the capacitor top metal CTM and the capacitor bottom metal CBM may be interconnected to an aluminum pad AP through a metal pad layer PD and a via V. A passivation layer PAL may cover a peripheral area of each of the aluminum pads AP and may reveal a central area of each of the aluminum pads AP for further connection. A planarization layer PL may be disposed on the passivation layer PAL. A metal contact C may be disposed in the planarization layer PL and the passivation layer PAL to electrically connect the aluminum pads AP with the fan-out wiring layer 202 in the RDL structure 200.

In some other embodiments, the MIM capacitors C1 and C2 could be formed by any adjacent metal layers and the insulator layer therebetween during a stacked metal interconnection scheme in the dummy die 21. For example, the capacitor top metal CTM and the capacitor bottom metal CBM of the MIM capacitor C1 are deposited in the M(n) metal layer and M(n−1) metal layer, respectively, while the capacitor top metal CTM and the capacitor bottom metal CBM of the other MIM capacitor C2 are deposited in the M(n−1) metal layer and the M(n−2) metal layer, respectively, but is not limited thereto.

According to one embodiment, for example, the functional die 12 may comprise a plurality of active circuit elements T such as MOS transistors fabricated on a semiconductor substrate S, but is not limited thereto. A plurality of inter-layer dielectric (ILD) layers D may be deposited on the semiconductor substrate S. A metal interconnection scheme ML may be formed in the plurality of ILD layers D to interconnect the terminals of the plurality of active circuit elements T to the respective aluminum pads APF. A passivation layer PAL may cover a peripheral area of the aluminum pad APF and may reveal a central area of the aluminum pad APF for further connection. A planarization layer PL may be disposed on the passivation layer PAL. A metal contact CF may be disposed in the planarization layer PL and the passivation layer PAL to electrically connect the aluminum pad APF with the fan-out wiring layer 202 in the RDL structure 200.

According to one embodiment, to form the fan-out SiP 1, for example, the dummy die 21 and the functional dies 11~13 are molded together so as to form a reconstructed wafer. After the formation of the RDL structure 200 connecting to the functional dies 11, 12, and 13 and the dummy die 21, the reconstructed wafer is sawed into a plurality of multi-die packages. The multi-die package including the functional dies 11, 12, and 13 and the dummy die 21 is then mounted on the package substrate 100 by surface mount technique (SMT) and connecting elements 310 comprising micro-bumps, pillars, or solders, for example, solder-capped copper bumps or pillars, are formed between the RDL structure 200 and the package substrate 100.

The functional dies 11, 12, and 13 are electrically connected to the package substrate 100 through the connecting elements 310 and the RDL structure 200. An underfill material 320 may be used to fill the gap between the RDL structure 200 and the package substrate 100. The underfill material 320 surrounds the connecting elements 310. Further, a plurality of die-side capacitors DSC may be disposed on the upper surface of the package substrate 100. The package substrate 100 serves to provide mechanical stability to the functional dies 11, 12, and 13 as well as interconnections for the functional dies 11, 12, and 13. The complexity of a package substrate 100 is based upon the signal complexity and pinout requirements of each specific section of integrated circuit supported by the package substrate 100. Package substrate layer count, material selection, and design rules are strongly related to the complexity of the package substrate. On a lower surface of the package substrate 100, a plurality of connecting elements 110 such as solder balls or ball-grid array (BGA) balls are disposed for the connection to a system board or a printed circuit board. Further, a plurality of land-side capacitors LSC may be disposed on the lower surface of the package substrate 100.

One type of the package substrate 100 used in fabricating IC packages is a single-core organic package substrate, which includes a single organic core layer 101 composed of an organic material and build-up layers 102 formed on top or below the single organic core layer. The build-up layers 102 provide interconnectivity for I/O, power, configuration information, etc. It is understood that the structure shown in FIG. 2 is for illustration purposes only. Other types of package substrates may be employed without departing from the spirits of the invention.

Figure 4:
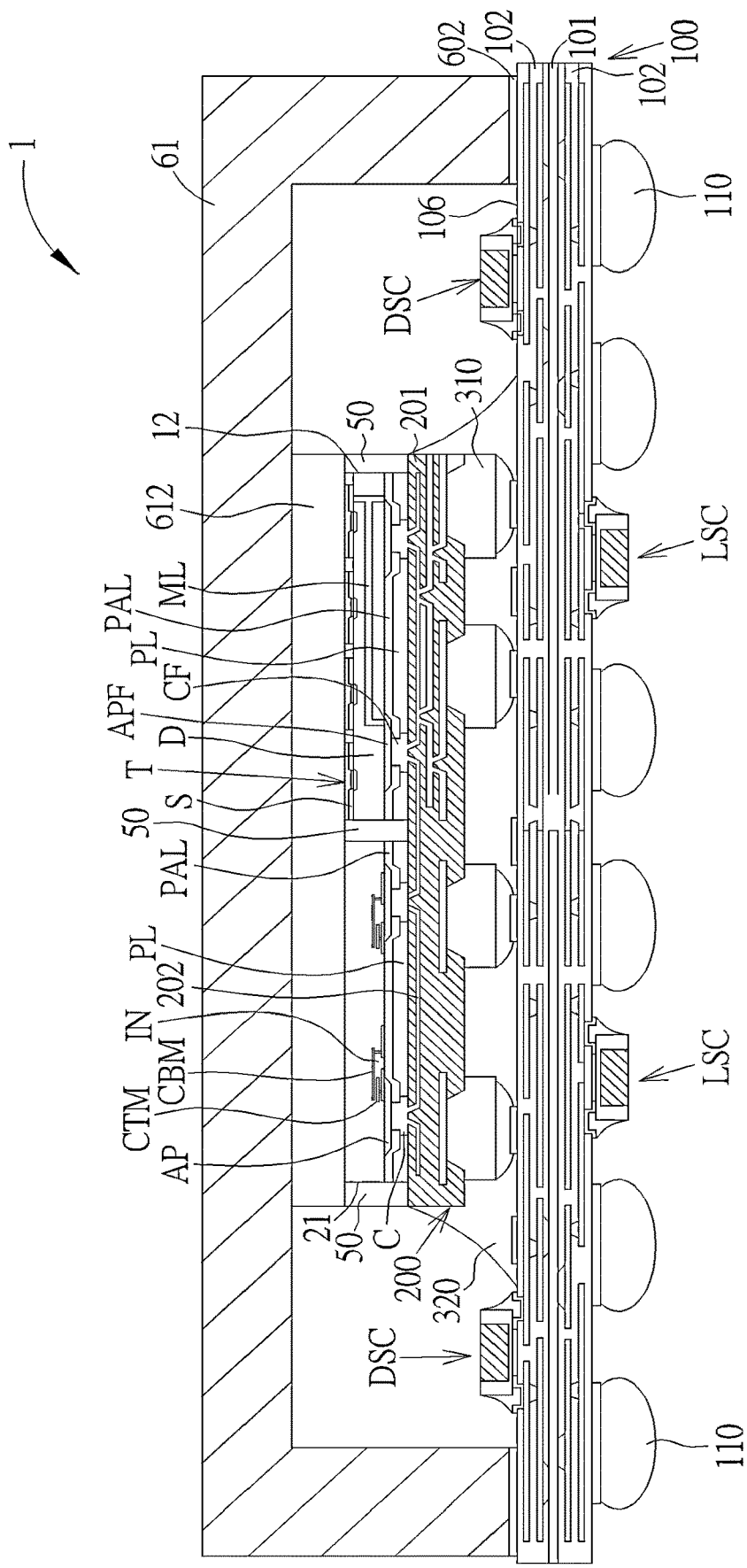
FIG. 4 is a schematic, cross-sectional diagram showing a fan-out SiP with a dummy MIM capacitor die and a metal lid according to another embodiment.

According to one embodiment, a stiffener ring 60 for warpage control may be disposed on the package substrate 100. The stiffener ring 60 provides extra support to the fan-out SiP 1 thus reducing warpage. According to one embodiment, for example, the stiffener ring 60 may comprise a metal ring such as a copper ring, but is not limited thereto. According to one embodiment, for example, the stiffener ring 60 may be secured to a top surface of the package substrate 100 by using an adhesive layer 602. For example, the stiffener ring 60 may be directly adhered onto a solder mask layer 106 along the perimeter of the package substrate 100. In some embodiments, as shown in FIG. 4, a metal lid 61 or a heat sink (not shown) may be disposed on the fan-out SiP 1. The metal lid 61 is in thermal contact with the dummy die 21 and the functional die 12 through a thermal interface material (TIM) layer such as thermal grease or thermal gel known in the art.

According to one embodiment, for example, for a dummy die having a size of 7167*6955 $\mu m^2$ (by N16 process), the total capacitance value is about 0.6 $\mu F$. Therefore, the dummy die 21 could contribute capacitance value to have more decoupling effect, thereby improving the power integrity. The MIN performance could be distributed in all dummy die area and may adopt foundry MIM rules. In some embodiments, the number of the die-side capacitors DSC can be reduced. This is beneficial because the foot width W of the stiffener ring 60 can be increased thereby improving the package warpage.

In FIG. 1, the functional die 12 and the functional die 13 are disposed diagonally to each other, and the functional die 11 and the dummy die 21 are disposed diagonally to each other. However, it is understood that the layout in FIG. 1 is for illustration purposes only. In some embodiments, the functional dies may have a symmetric or asymmetric arrangement.

Figure 5:
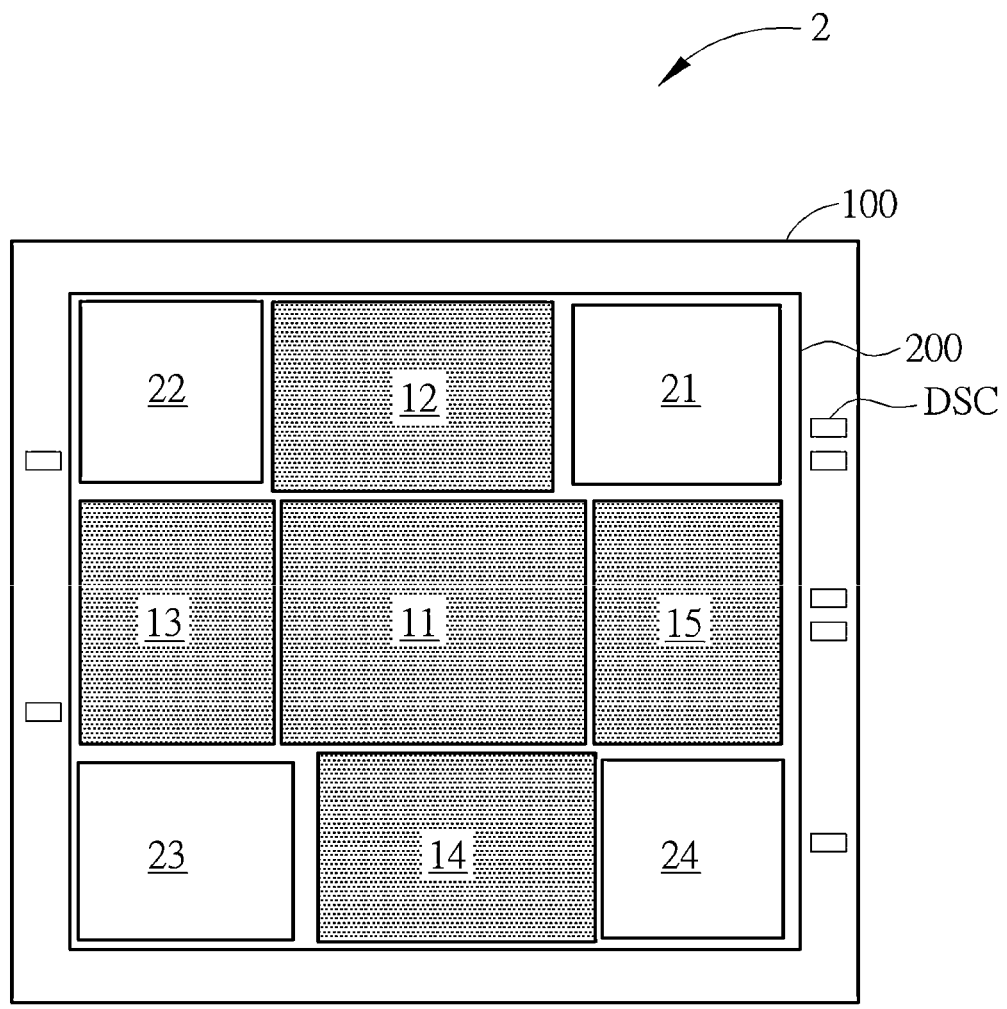
FIG. 5 shows another exemplary layout of a fan-out SiP with multiple functional dies and multiple dummy dies according to another embodiment.

FIG. 5 shows an exemplary layout of a fan-out SiP 2 with multiple functional dies and multiple dummy dies according to another embodiment, wherein like layers, regions, or elements are designated by like numeral numbers or labels. As shown in FIG. 5, the five functional dies 11~15 are arranged in a cluster. For example, the central die 11 may be a SoC die, and the peripheral four dies 12~15 such as a DRAM memory die, a flash memory die, a networking die, an Accelerated Processing Unit (APU) die, a RF die, or the like may be disposed around the perimeter of the central die 11. Likewise, the four dies 12~15 are electrically connected to the central die 11 through the RDL structure 200. The four dummy dies 21~24, which are free of any active circuit elements such as MOS transistors, are disposed at respective four corners of the fan-out SiP 2 to balance process loading effect and to improve the warpage control. Likewise, each of the four dummy dies 21~24 has MIM capacitors as described in FIG. 2 and these MIM capacitors are interconnected to at least one of the functional dies 11~15 through the RDL structure 200.

Figure 6:
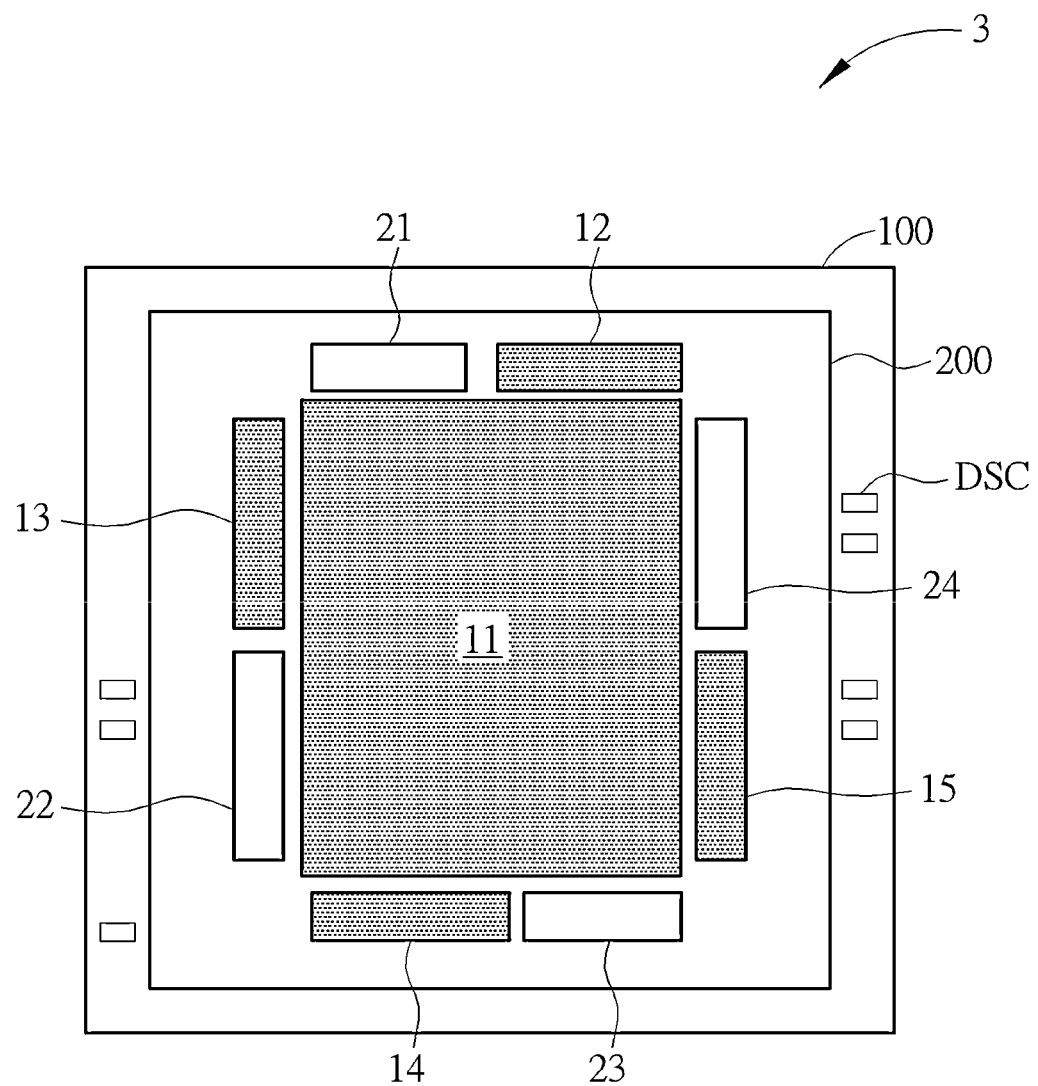
FIG. 6 shows an exemplary layout of a fan-out SiP with multiple functional dies and multiple dummy dies according to another embodiment.

FIG. 6 shows an exemplary layout of a fan-out SiP 3 with multiple functional dies and multiple dummy dies according to another embodiment, wherein like layers, regions, or elements are designated by like numeral numbers or labels. As shown in FIG. 6, the five functional dies 11~15 are arranged in a cluster. For example, the central die 11 may be a SoC die, which occupies a greater area, and the peripheral four dies 12~15 such as a memory die, a flash die, a networking die, a RF die, or the like, which occupy a smaller area, may be disposed around the perimeter of the central die 11. Likewise, the four dies 12~15 are electrically connected to the central die 11 through the RDL structure 200. The four dummy dies 21~24, which are free of any active circuit elements such as MOS transistors, are disposed along the perimeter of the central die 11 and between the peripheral four dies 12~15 to balance process loading effect and to improve the warpage control. Likewise, each of the four dummy dies 21~24 has MIM capacitors as described in FIG. 2 and these MIM capacitors are interconnected to at least one of the functional dies 11~15 through the RDL structure 200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a fan-out package comprising multiple functional dies; at least one dummy die free of active circuit, wherein the at least one dummy die comprises a semiconductor die that includes at least one capacitor device element; a redistribution layer (RDL) structure interconnecting the at least one capacitor device element to at least one of the multiple functional dies; and a molding compound encapsulating and surrounding the multiple functional dies and the at least one dummy die;
   a package substrate interconnecting to the RDL structure of the fan-out package through a plurality of first connecting elements comprising micro-bumps or pillars; and
   an underfill material filling a gap between the RDL structure and the package substrate, wherein the underfill material surrounds the plurality of first connecting elements.

2. The semiconductor package according to claim 1, wherein the at least one capacitor device element comprises a metal-insulator-metal (MIM) capacitor.

3. The semiconductor package according to claim 2, wherein the MIM capacitor comprises a capacitor bottom metal, a capacitor top metal, and an insulator layer between the capacitor bottom metal and the capacitor top metal.

4. The semiconductor package according to claim 3, wherein the RDL structure comprises a dielectric layer and a fan-out wiring layer that interconnects the at least one dummy die to the at least one of the multiple functional dies.

5. The semiconductor package according to claim 4, wherein the capacitor top metal and the capacitor bottom metal are interconnected to an aluminum pad AP through a metal pad layer and a via, wherein a passivation layer covers a peripheral area of the aluminum pad.

6. The semiconductor package according to claim 5, further comprising:
   a planarization layer disposed on the passivation layer;
   a metal contact C disposed in the planarization layer and the passivation layer to electrically connect the aluminum pad with the fan-out wiring layer in the RDL structure.

7. The semiconductor package according to claim 1, wherein the multiple functional dies are arranged in a side-by-side manner on the RDL structure.

8. The semiconductor package according to claim 1, further comprising:
   at least one die-side capacitor mounted on the top surface of the package substrate.

9. The semiconductor package according to claim 1, further comprising:
   at least one land-side capacitor mounted on a lower surface of the package substrate.

10. The semiconductor package according to claim 9, wherein a plurality of second connecting elements is disposed on the lower surface of the package substrate, wherein the plurality of second connecting elements comprises ball grid array (BGA) balls.

11. The semiconductor package according to claim 1, wherein the semiconductor die is a silicon die.

12. The semiconductor package according to claim 1, further comprising:
   a stiffener ring mounted on a top surface of the package substrate.

* * * * *